United States Patent [19]

Choi

[11] Patent Number: 4,859,278

[45] Date of Patent: Aug. 22, 1989

[54] FABRICATION OF HIGH RESISTIVE LOADS UTILIZING A SINGLE LEVEL POLYCIDE PROCESS

[75] Inventor: Francis K. Choi, Rosemead, Calif.

[73] Assignee: Xerox Corporation, Stamford, Conn.

[21] Appl. No.: 231,404

[22] Filed: Aug. 11, 1988

[51] Int. Cl.$^4$ ............ H01L 21/306; B44C 1/22; C23F 1/02; C03C 15/00

[52] U.S. Cl. .................. 156/643; 156/652; 156/656; 156/657; 156/659.1; 156/662; 156/653; 357/23.11; 357/42; 357/44; 357/59; 437/34; 437/41; 437/200; 437/201

[58] Field of Search .............. 437/34, 41, 45, 56, 437/57, 58, 59, 196, 200, 201; 156/643, 646, 652, 656, 657, 659.1, 661.1, 653, 662; 357/23.1, 23.9, 23.11, 23.13, 41, 42, 44, 59, 49

[56] References Cited

U.S. PATENT DOCUMENTS

| | | | |
|---|---|---|---|
| 4,451,328 | 5/1984 | Dubois | 156/656 |
| 4,453,306 | 6/1984 | Lynch et al. | 156/656 X |
| 4,640,844 | 2/1987 | Neppl et al. | 437/34 X |
| 4,740,479 | 4/1988 | Neppl et al. | 437/34 |
| 4,782,033 | 11/1988 | Gierisch et al. | 437/200 X |
| 4,786,611 | 11/1988 | Pfiester | 437/200 X |

Primary Examiner—William A. Powell

[57] ABSTRACT

This invention relates to a method of fabricating high resistive loads utilizing a single level polycide process in very large scale integrated circuits. By etching away a top silicide layer which exposes an underlying polysilicon layer and then implanting with a heavy dose of boron, a high resistive load on the integrated circuit is formed. Very often the highly resistive polysilicon load is implemented as a second polysilicon layer, which increases the process complexity vastly. This invention discloses the use of only one polycide layer to implement both the low resistive gate and interconnect and the high resistive polysilicon load needed to implement certain circuit functions.

2 Claims, 4 Drawing Sheets

FABRICATION OF HIGH RESISTIVE LOADS UTILIZING A SINGLE LEVEL POLYCIDE PROCESS

This invention relates to a method of fabricating high resistive loads utilizing a single level polycide process in very large scale integrated circuits. By etching away a top silicide layer which exposes an underlying polysilicon layer and then implanting with a heavy dose of boron, the high resistive load on the integrated circuit is formed simultaneously on a single level polycide process. Very often the highly resistive polysilicon load is implemented as a second polysilicon layer, which increases the process complexity vastly. This invention discloses the use of only one polycide layer to implement both the low resistive gate and interconnect and the high resistive polysilicon load needed to implement certain circuit functions.

BACKGROUND OF THE INVENTION

In semicustom and custom VLSI designs, the designer is usually constrained by real estate utilization as a result of yield, which directly affects cost, and performance tradeoffs. By real estate is meant the extremely limited amount of room on a typical integrated circuit chip. In memory circuits and a lot of digital logic circuits it is desirable to have as much memory on a chip as possible, but, on the other hand, either the area that the cell occupies is too large due to limitations in the technology, as in a single polycrystalline silicon (polysilicon) process, or the circuit yield is lowered when double level polysilicon is used. The capability of fabricating a high resistive load on a chip is very important in putting any cross latched designs such as static random access memories (SRAMs), etc., on a chip because it can reduce the cell area. (A cross latched design refers to a circuit configuration that is used in a regenerative circuit. All static memory needs a regenerative circuit to retain a bistable state in digital memory.) It is preferrable to use a single polysilicon process due to yield concerns; however, for high performance VLSI chips, the polysilicon is usually replaced by polycide, which is a sandwiched layer of silicide and polysilicon with lower resistivity to improve performance. To date, there are no documented ways of fabricating high resistive polysilicon loads simultaneously in a single level polycide gate technology. Some prior art uncovered in this field is discussed below.

U.S. Pat. No. 4,640,844 to Neppl et al discloses a method of forming gate electrodes in a polycide layer. A polycide layer is produced by deposition of an undoped polycrystalline silicon layer on an n+ doped silicon substrate, followed by deposition of a tantalum disilicate layer on top of the polysilicon. Structuring of the gates is then accomplished by reactive ion etching. P channel source and drain zones are produced by boron ion implantation while a photoresist covers the zones of the n channel transistors. A second photoresist covers the zones of the p channel transistors while n channel source and drain zones are produced by arsenic ion implantation.

U.S. Pat. No. 4,406,051 to Iizuka discloses a method of manufacturing a semiconductor device in which a high resistivity element is formed by controlled doping of a polycrystalline silicon layer. A polycrystalline silicon layer is grown over a semiconductor substrate and patterned to cover a previously formed contact hole. A heavy doping of oxygen or nitrogen by ion implantation forms the resistive region.

U.S. Pat. No. 4,451,328 to Dubois discloses a process for forming high resistance elements in IC structures. A layer of polycrystalline silicon is deposited on an oxide insulated semiconductor substrate. Resistance is obtained in desired areas by diffusion or ion implantation. Resin plugs are placed in the resistive areas and conductive regions are created by further doping of unprotected areas. Finally, a metal silicide layer is deposited and the resin is etched to reveal the resistive elements.

According to the present invention, RIE (reactive ion etching) with appropriate end point detection plus a common doping technique is used to fabricate a high resistive load on a single level polycide in a typical NMOS/CMOS process. While in the SALICIDE (Self Aligned Silicide) CMOS process case, a new process is proposed to fabricate a high resistive load on a single level polycide process. By etching away a top silicide layer which exposes an underlying polysilicon layer and then implanting with a heavy dose of boron, the high resistive load on the integrated circuit is formed. Very often the highly resistive polysilicon is implemented as a second polysilicon layer, which increases the process complexity vastly. This invention proposes the use of only one polycide layer to implement both the low resistive gate and interconnect the high resistive polysilicon needed to implement certain circuit functions.

DESCRIPTION OF THE DRAWINGS

For a more complete understanding of the invention, reference may be had to the following detailed description of the invention in conjunction with the drawings wherein.

DETAILED DESCRIPTION OF THE INVENTION

Figure 1:
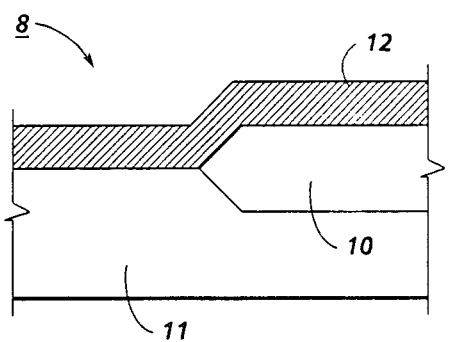
FIG. 1 is a schematic diagram of a side view of a silicon substrate with polysilicon deposited on the wafer.
Figure 2:
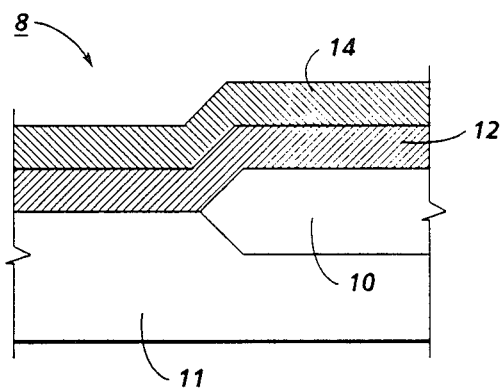
FIG. 2 is a schematic diagram of the side view of FIG. 1 with silicide deposited over the polysilicon to form polycide.

FIG. 1 shows a cross section of an integrated circuit transistor 8 wherein a normal gate area has been formed. That is, thick field oxide area 10 has been formed of silicon dioxide grown on the silicon substrate 11 by selective etching and oxygen flow oxidation. After the formation of the field oxide area 10, an undoped polysilicon layer is deposited over the entire surface. At this point the layer 12 of polysilicon is undoped, and is thus an insulator. Subsequent to the deposition of the polysilicon layer 12, arsenic (As) is implanted into the polysilicon layer rendering it conductive. The polysilicon layer 12 can also be doped by phosphorus (P) by utilizing the POCl3 process. (This is a doping by diffusion process in which a carrier gas, usually nitrogen, is bubbled through a bottle of POCl3, or phosphorus oxy-trichloride, and delivered into a furnace tube where the silicon wafers sit.) The application of the arsenic ion is at a rate say, 70 kev/8 E 15 $cm^{-2}$, so that the dopant implant will not extend through to the silicon substrate. The polysilicon layer is, at this point, about 0.15–0.25 microns thick. The dopant energy is chosen to enter it into the polysilicon only about 600–1200 Å, or about one-half of its thickness. The polysilicon now becomes conductive due to the higher level of dopant material. After the doping of the polysilicon layer 12, a layer of silicide 14 is deposited on the polysilicon to form a layer commonly termed a polycide layer 12 and 14. See FIG. 2. This polycide layer 14 has a sheet resistance of about ten times less than the original polysilicon layeer. A silicide is a material formed by the reaction between silicon and metal such as tungsten, titanium, and platinum etc., to form tungsten silicide, titanium silicide and platinum silicide, etc. Most silicide used in semiconductor industry uses the refractory metal and the noble metals. The silicide layer can be deposited by either CVD (chemical vapor deposition) or by a cosputtering technique.

Figure 3:
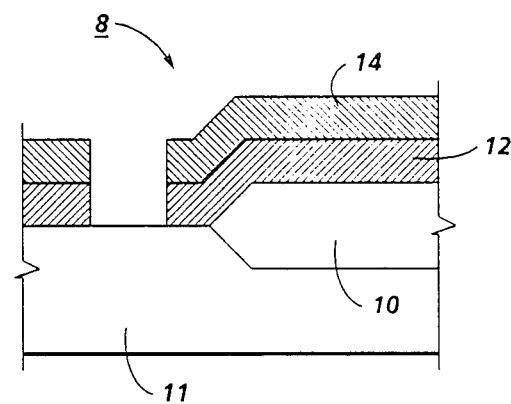
FIG. 3 is a schematic diagram of the said side view wherein the polycide is masked and etched to form gate and interconnects.

In FIG. 3, the polycide layer is masked and etched by using a photoresist as a mask and plasma or reactive ion etching process to form the gate and interconnects. The wafer 8 then goes through an implant of phosphorus or arsenic to form the source/drain region. In NMOS processing this implant is usually a blanket implant. In CMOS processing, there are two different implant steps to form the N+ and P+ source/drain area. Both of these implants are usually masked. The N+ is formed when arsenic (As) and/or phosphorus (P) is implanted into the silicon wafer. The P+ region is formed when boron (B) is implanted into the silicon wafer. The wafer 8 usually goes though some sort of thermal oxidation or oxidation by RTA (rapid thermal annealing) to seal off the polycide areas 14 with a thin oxide.

Figure 4:
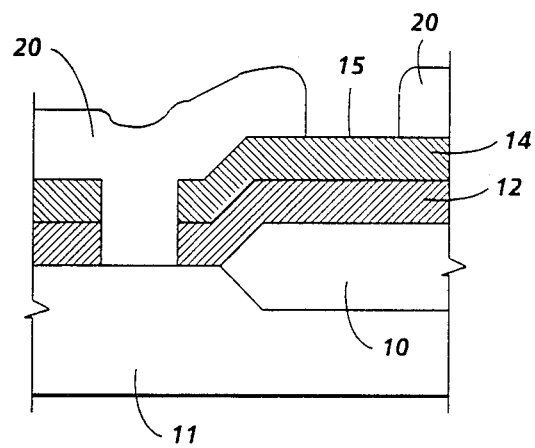
FIG. 4 is a schematic diagram thereof where the wafer is again masked only where the resistive element is to be formed.

The wafer 8 in FIG. 4 is now masked again. That is, a layer of photoresist 20 is now deposited on the polycide layer 14. Then the photoresist 20 is exposed through a photomask, not shown, as is well known in the integrated circuit art. When the photoresist is developed, some of it will be removed in accordance with the pattern of light and dark areas through the photomask. There is now an open area 15 through which is exposed the surface of the silicide 14. This open area exposing the silicide area is where the resistive element is to be formed. Through a series of etching operations with appropriate endpoints, the silicide layer is etched away exposing the polysilicon layer 12. See FIG. 5. The etching can be done in either dry or wet etching. In dry etching in either plasma or reactive ion etch mode the end point detection will be critical to avoid damage to the underlying polysilicon film. In wet etching an appropriate etchant that will not attack the underlying polysilicon have to be selected. Then a heavy dose of boron implant with dose of about 1–5E16 $cm^{-2}$ is accomplished with low energy of less than say, 50 keV on the polysilicon 12 to fabricate the high resistive load elements. The implanted Boron species is used to overcompensate the phosphorus or arsenic previously doped into the polysilicon layer 12. The overcompensation reduced the heavily doped n-type polysilicon to a more or less intrinsic polysilicon, thereby increasing the polysilicon layer 12 sheet resistance. The sheet resistance of this high resistive polysilicon depends very sensitively on the previous doping of the polysilicon layer 12, the previous and future heat treatment of the wafer 8 and on the dose and energy of the Boron implant. Because Boron can penetrate the polysilicon easily, the energy must not be so high that the Boron will not stay inside the polysilicon.

Figure 5:
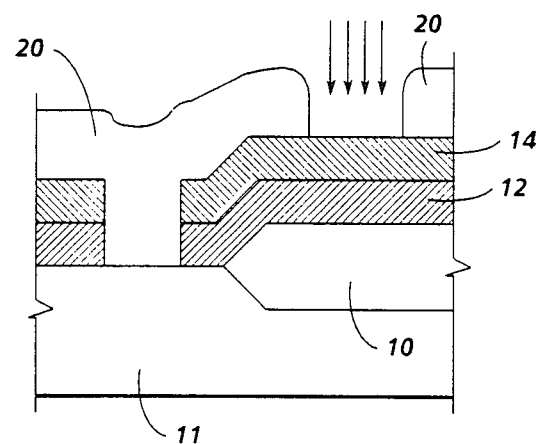
FIG. 5 is a schematic diagram thereof where the top silicide layer is now etched away and a heavy dose of boron implant is applied.
Figure 6:
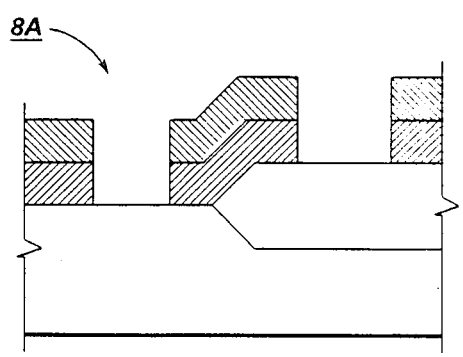
FIG. 6 is a schematic diagram thereof where the photoresist is stripped off for further processing.

FIG. 6 shows the result of the process in FIG. 5 after the photoresist has been stripped. The wafer 8 can now proceed to the next step in processing. The wafer 8 usually goes through some sort of high temperature process like furance oxidation or oxidation through RTA (rapid thermal annealing) to activate and anneal the implanted species. The wafer 8 would then go through the normal back-end MOS processing of putting in LTO (low temperature oxide) to passivate the devices and then all the metal interconnects for routing of informations on the chip. That is, in summary, a highly resistive polysilicon can be fabricated simultaneously on a single level polycide with both very low and very high sheet resistances.

Figure 7:
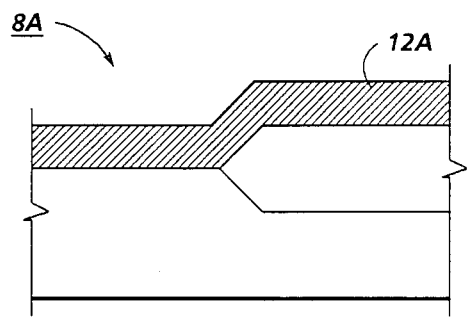
FIG. 7 is a schematic diagram of a side view of a silicon substrate with polysilicon deposited on the wafer in an alternate embodiment using a salicide process.

A second embodiment of the present invention is shown in FIGS. 7 to 11. This embodiment involves the fabrication of a high resistive polysilicon in a single level polycide SALICIDE process (Self Aligned Silicide process). The SALICIDE process is a rather common process in advanced CMOS technology. In this technology silicides are formed at the gate level and the source and drain region simultaneously, the source and drain sheet resistance can thus also be reduced. FIG. 7 shows the polysilicon layer 12 being deposited and doped by either implantation techniques or by POCl3 (phosphorus oxy-trichloride) on a silicon wafer 8a. The polysilicon is deposited on a silicon wafer 8a wherein a thick silicon oxide known as gate oxide have been selectively grown.

Figure 8:
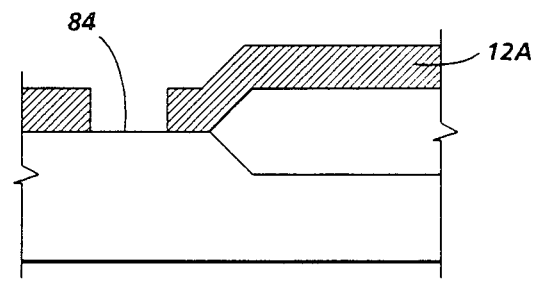
FIG. 8 is a schematic diagram of the side view of FIG. 7 wherein the polysilicon is etched away in a predetermined pattern.

FIG. 8 shows the polysilicon gate 84 and interconnect 12a being delineated. The delineation is done through a masking and etching step. The masking step is accomplished by depositing a photoresist on to the wafer 8 and light is shined through a photomask with circuit patterns and exposes the photoresist. Photoresist in the unwanted area is then developed out. The etching is typically done in a plasma or in a reactive ion mode. A near vertical polysilicon side wall is preferred for this process. The photoresist is then completely stripped away.

Figure 9:
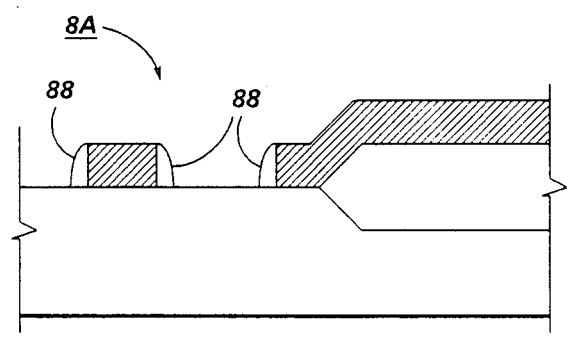
FIG. 9 is a schematic diagram thereof wherein oxide spacers are formed at the edges of the polysilicon.

FIG. 9 shows oxide deposition and spacer etch to fabricate oxide spacers 88. The formation of an oxide spacer is the key to the SALICIDE process. An oxide layer of about 3000–5000 Å is typically deposited onto the wafer. The wafer is then etched in a reactive ion etcher. Since the etching is anisotropic, an oxide spacer of about 0.25–0.5 um. in lateral dimenion is fabricated next to the polysilicon layers as shown in the figure.

Figure 10:
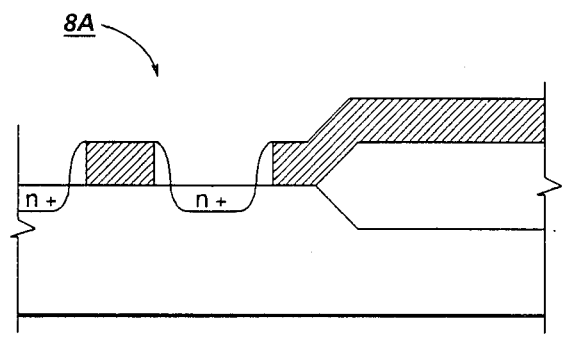
FIG. 10 is a schematic diagram thereof wherein source and drain areas are formed by S/D (source/drain) implant masks.

FIG. 10 shows the source and drain formation by source/drain implant and the masking of the resistive polysilicon region. In NMOS processing, the source and drain region is formed by a blanket implant of arsenic (As) or Phosphorus (P) or by means of diffusion doping. In CMOS processing, the source and drain of the N-channel and P-channel devices are usually formed by a separate masking and implant or doping steps. In these masking steps the resistive polysilicon region can be masked off. On the completion of the source and drain region doping, the wafer 8 usually goes through some re-oxidation for sealing and annealing of the device.

Figure 11:
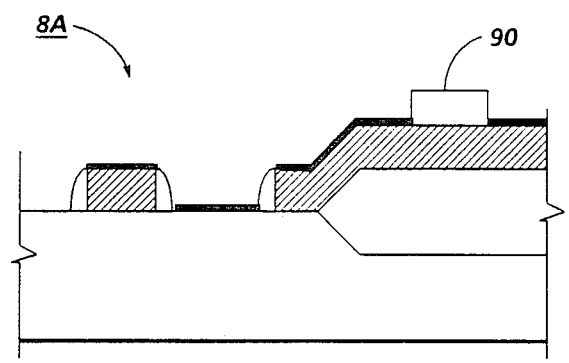
FIG. 11 is a schematic diagrm thereof wherein a metal is deposited for forming the polycide and a photoresist layer is used to define the high resistive area.

FIG. 11 shows the fabrication of the high resistive polysilicon simultaneously on the single level polycide. After source and drain region formation, the wafer 8a is now masked and the region for the resistor is defined by the photoresist 90. A metal that forms silicide with silicon is then sputtered onto the wafer. In semiconductor industry the metal is normally a refractory or noble metal like tungsten, titanium or platinum. Because of the presence of a thick photoresist, the metal deposited over the edge of the photoresist will tend to be very thin and can be easily broken off. A lift off technique is done to remove this metal sputtered on top of the photoresist region, therefore the polysilicon lines on the wafer surface will now be covered with the sputtered metal except in the resistive region. RTA (rapid thermal annealing) or furnance anneal is now done to the wafer to allow a chemical reaction between the metal and the underlying polysilicon to take place. After polycide is formed a blanket Boron implant is done with appropriate dose and energy to conert the highly conductive polysilicon to a highly resistive region. Then the unreacted metal is stripped away. The metal and the upper silicide layer serves as an implant mask to the high dose Boron. A high temperature treatment by RTA or furnance is then done to activate the implanted species electrically. The wafer 8a is now ready for passivation and the addition of the back-end metallization process, which is typical to any MOS processing. In summary, a new process is described here to fabricate a high resistive polysilicon on a single level polycide SALICIDE process.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A method of fabricating high resistive loads in a very large scale integrated circuit comprising
   depositing an undoped layer of polysilicon over a predetermined area of said integrated circuit,
   doping said layer of polysilicon to render it conductive,
   depositing a layer of metallic silicide on said polysilicon layer to form a layer generally termed a polycide layer,
   masking and etching said polycide layer to form the gates and interconnect links,
   implanting said gate areas to form the source/drain areas of said integrated circuit,
   masking and etching said polycide layer to expose an area of said polycide wherein said silicide layer is etched away at said exposed area down to the polysilicon layer, and
   implanting said exposed area of polysilicon with a heavy dose of boron to fabricate said high resistive load element.

2. A method of fabricating high resistive loads in a very large scale integrated circuit comprising
   depositing an undoped layer of polysilicon over a predetermined area of said integrated circuit,
   doping said layer of polysilicon to render it conductive,
   masking and etching said polycide layer to form the gates and interconnect links,
   oxide depositing and anisotropic etching said gates and interconnecting links to form oxide spacers in the gate and interconnect link areas next to the polysilicon layers,
   implanting said gate areas to form the source/drain areas of said integrated circuit,
   masking and etching said polysilicon layer to define an area of said polysilicon with photoresist material,
   depositing a metallic silicide on said polysilicon layer with photoresist to form an metal overhanging area on the desirable resistive region amd a layer layer generally termed polycide layer elsewhere,
   removing said photoresist material defining said area, and
   implanting said defined area of polysilicon with a heavy dose of boron to fabricate said high resistive load element.

* * * * *